(12) United States Patent
Kim

(10) Patent No.: US 9,543,312 B1
(45) Date of Patent: Jan. 10, 2017

(54) METHOD FOR MANUFACTURING A NONVOLATILE MEMORY DEVICE

(71) Applicant: SK hynix Inc., Icheon-si, Gyeongi-do (KR)

(72) Inventor: Do-Young Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/943,680

(22) Filed: Nov. 17, 2015

(30) Foreign Application Priority Data

Jul. 13, 2015 (KR) .......................... 10-2015-0098959

(51) Int. Cl.
| H01L 27/115 | (2006.01) |
| H01L 29/66  | (2006.01) |
| H01L 21/265 | (2006.01) |
| H01L 21/28  | (2006.01) |
| H01L 29/36  | (2006.01) |
| H01L 29/423 | (2006.01) |
| H01L 29/788 | (2006.01) |

(52) U.S. Cl.
CPC ....... *H01L 27/11546* (2013.01); *H01L 21/265* (2013.01); *H01L 21/28273* (2013.01); *H01L 27/11521* (2013.01); *H01L 27/11526* (2013.01); *H01L 29/36* (2013.01); *H01L 29/42324* (2013.01); *H01L 29/66825* (2013.01); *H01L 29/788* (2013.01)

(58) Field of Classification Search
CPC .............................................. H01L 27/11546
USPC ................................................ 438/201, 258
See application file for complete search history.

(56) References Cited

U.S. PATENT DOCUMENTS

| 6,069,033 A *   | 5/2000 | Verhaar ............... H01L 21/8238 257/E21.632 |
| 6,248,619 B1 *  | 6/2001 | Lee .................. H01L 21/823807 257/E21.633 |
| 7,247,890 B2 *  | 7/2007 | Sekiguchi ......... H01L 27/10873 257/192 |
| 2001/0004120 A1* | 6/2001 | Colclaser .............. H01L 27/105 257/326 |
| 2003/0011034 A1* | 1/2003 | Byun ............... H01L 21/823892 257/369 |
| 2005/0087810 A1* | 4/2005 | Sadra ................ H01L 21/76229 257/368 |
| 2006/0138568 A1 | 6/2006 | Taniguchi et al. |
| 2014/0162417 A1* | 6/2014 | Utsuno ............. H01L 27/11531 438/264 |
| 2014/0284682 A1* | 9/2014 | Takekida .............. H01L 29/788 257/316 |
| 2015/0069488 A1* | 3/2015 | Matsumori ....... H01L 27/11529 257/315 |

* cited by examiner

*Primary Examiner* — George Fourson, III
(74) *Attorney, Agent, or Firm* — William Park & Associates Ltd.

(57) ABSTRACT

A method for manufacturing a nonvolatile memory device in accordance with an embodiment of the present invention may include providing a substrate comprising a cell region and a peripheral region, wherein the peripheral region comprises an NMOS region and a PMOS region; performing a well forming ion implantation over the substrate in the cell region and the NMOS region; performing a threshold voltage adjusting ion implantation over a surface of the substrate in the cell region and the NMOS region; forming a gate pattern comprising a floating gate electrode in the cell region and the peripheral region; and performing a junction ion implantation over a surface of the cell region, wherein the floating gate electrode may have P-type conductivity.

12 Claims, 6 Drawing Sheets

METHOD FOR MANUFACTURING A NONVOLATILE MEMORY DEVICE

CROSS-REFERENCE TO RELATED APPLICATION

This application claims priority under 35 U.S.C. §119 to Korean Patent Application No. 10-2015-0098959 filed on Jul. 13, 2015, the disclosure of which is herein incorporated by reference in its entirety.

BACKGROUND

1. Technical Field

Embodiments of the present invention relate to a method of manufacturing a semiconductor device, and more particularly, to a method of manufacturing a nonvolatile memory device.

2. Background Art

As a NAND flash device has become highly integrated in recent years, an area or a linewidth of a floating gate (FG) has decreased. Due to the decrease in the area of the FG, problems such as a decrease in program speed, a decrease in capability of storing data, and thus deterioration of reliability occur. Moreover, interference by coupling of adjacent cells is also increased.

SUMMARY

Various embodiments are directed to a method for manufacturing a nonvolatile memory device capable of improving productivity and reliability of the device by employing a P-type conductive material as a floating gate electrode and simultaneously forming wells in a cell region and a peripheral region.

In an embodiment, a method for manufacturing a nonvolatile memory device may include providing a substrate including a cell region and a peripheral region, wherein the peripheral region may include an NMOS region and a PMOS region; performing a well forming ion implantation over the substrate in the cell region and the NMOS region; performing a threshold voltage adjusting ion implantation over a surface of a substrate in the cell region and the NMOS region; forming a gate pattern comprising a floating gate electrode in the cell region and the peripheral region; and performing a junction ion implantation over a surface of the cell region, wherein the floating gate electrode may have P-type conductivity.

In particular, the method may further include forming a first mask pattern which leaves open the cell region and the NMOS region, wherein the first mask pattern is formed over the substrate in the PMOS region before performing well forming ion implantation. Moreover, in the performing the well forming ion implantation, a P-type dopant for forming a P-type well may be used.

Also, in performing the threshold voltage adjusting ion implantation, an N-type dopant may be used. Further, in performing the threshold voltage adjusting ion implantation, arsenic (As) may be used. Moreover, in performing the threshold voltage adjusting ion implantation, ion implantation energy may be controlled such that a buried channel is not formed at the bottom of a gate pattern in the cell region. Also, the method may further include forming a second mask pattern in the peripheral region, wherein the second mask pattern leaves open the cell region over the substrate and the second mask pattern is formed before performing the junction ion implantation. Moreover, performing the junction ion implantation may be achieved with a counter doping. Further, in performing the junction ion implantation, dose may be controlled such that a dopant which is implanted in the junction ion implantation is offset. Also, in performing the junction ion implantation, a P-type dopant may be used. Moreover, in performing the junction ion implantation, boron may be used.

Further, forming the gate pattern may include forming a stack of a floating gate layer, a tunnel barrier layer, and a control gate layer; and patterning the control gate layer, the tunnel barrier layer and the floating gate layer.

In another embodiment, a nonvolatile memory device comprises a substrate including a cell region and a peripheral region, wherein the peripheral region comprises an NMOS region and a PMOS region, and performing a well forming ion implantation over the substrate in the cell region and the NMOS region. A surface of the substrate in the cell region and the NMOS region may receive a threshold voltage adjusting ion implantation. A gate pattern comprising a floating gate electrode may be formed in the cell region and the peripheral region, and a junction ion implantation may be performed over a surface of the cell region. The floating gate electrode may have a P-type conductivity.

In one example, a first mask pattern which leaves open the cell region and the NMOS region may be formed, wherein the first mask pattern is formed over the substrate in the PMOS region before performing the well forming ion implantation. In performing the well forming ion implantation a P-type dopant may be used for forming a P-type well, and in performing the threshold voltage adjusting ion implantation at least one of an N-type dopant or arsenic is used.

The nonvolatile memory device includes forming a second mask pattern in the peripheral region, wherein the second mask pattern leaves open the cell region over the substrate and the second mask pattern may be formed before performing the junction ion implantation. Performing the junction ion implantation may be achieved with a counter doping where a dose is controlled such that a dopant, which is implanted in the junction ion implantation, is offset.

In performing the junction ion implantation at least one of a P-type dopant or a P-type dopant including boron may be used. Forming the gate pattern includes forming a stack of a floating gate layer, a tunnel barrier layer, and a control gate layer, and patterning the control gate layer, the tunnel barrier layer, and the floating gate layer.

DETAILED DESCRIPTION

Figure 1A:
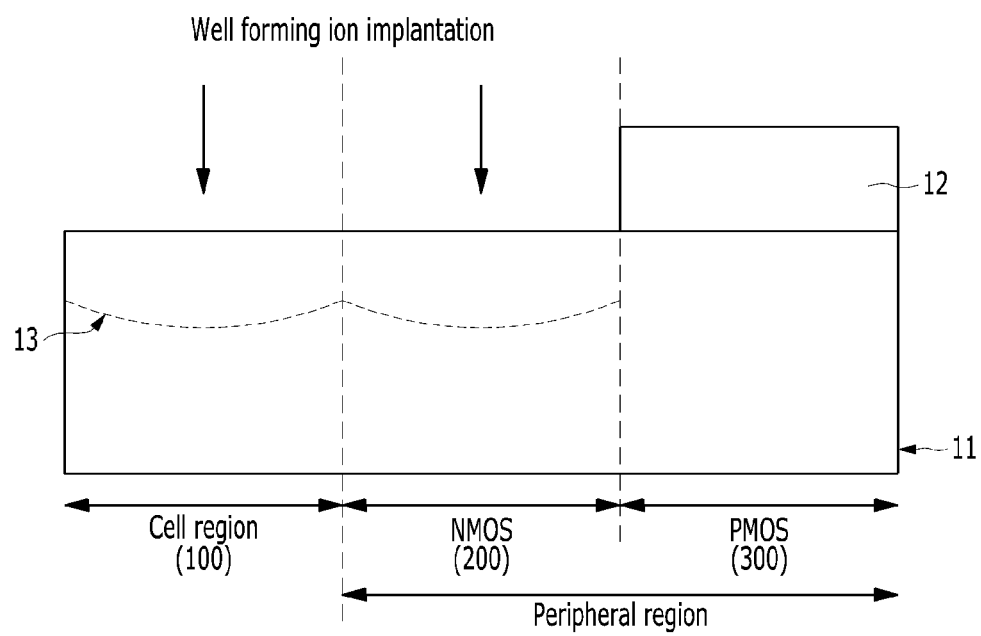
FIGS. 1A to 1E are cross-sectional views illustrating a method of forming a nonvolatile memory in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey a scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In recent years, in order to overcome problems caused by high integration of a NAND flash device, a P-type conductive material having a work function which is 1 V higher than an N-type conductive material was used as a floating gate electrode. In this case, it is required to perform different ion implantation processes with respect to a cell region and a peripheral region because of a difference in properties between the cell region and the peripheral region. Accordingly, processes for forming a P-type well are separately performed on substrates of the cell region and an NMOS region in the peripheral region using respective mask processes. However, since the mask processes are added, the number of processes and a manufacturing cost are increased. In order to overcome such drawbacks, according to an embodiment of the present invention, P-type wells in the cell region and the peripheral region are simultaneously formed.

FIGS. 1A to 1E are cross-sectional views illustrating a method of forming a nonvolatile memory in accordance with an embodiment of the present invention. FIGS. 2A to 2D illustrate graphs showing device properties depending on boron dose.

As shown in FIG. 1A, substrate 11 may include a cell region 100 and peripheral region 200 and 300. Specifically, in accordance with an embodiment, the peripheral region may include a Low Voltage NMOS (LVN) region 200 and a Low Voltage PMOS (LVP) region 300. For convenience of explanation, hereinafter, the LVN region is referred to as an NMOS region 200 and the LVP region is referred to as a PMOS region 300.

A screen oxide (not shown) may be formed on the substrate 11. The screen oxide may function as a buffer layer which prevents the substrate 11 from being damaged during subsequent ion implantation processes.

A first mask pattern 12 may be formed in the PMOS region 300 of the peripheral region. The first mask pattern 12 may be formed by coating a photosensitive layer on the substrate 11. In one example, the first mask pattern 12 is formed over the substrate 11 in the PMOS region 300 before performing well ion implementation. Further, the photosensitive layer (i.e., the mask pattern 11) is patterned to leave the cell region 100 and the NMOS region 200 open to exposure and development.

In one example, the first mask pattern 12 is formed over the substrate in the PMOS region 300 before a well forming ion implantation process is performed in the cell region 100 and the NMOS region 200. The well forming ion implantation process may be performed by using a P-type dopant. For example, the P-type dopant may include boron. As a result, a P-type well region 13 may be formed over the substrate 11 in the cell region 100 and the NMOS region 200.

As such, since the P-type well region 13 is formed in the cell region 100 and the NMOS region 200 by a single mask process, a mask process and an additional ion implantation process may be omitted and thus a process margin may be increased. Before the well forming ion implantation process, it is possible to perform an ion implantation process for forming a triple N-well in order to isolate the cell region.

Figure 1B:
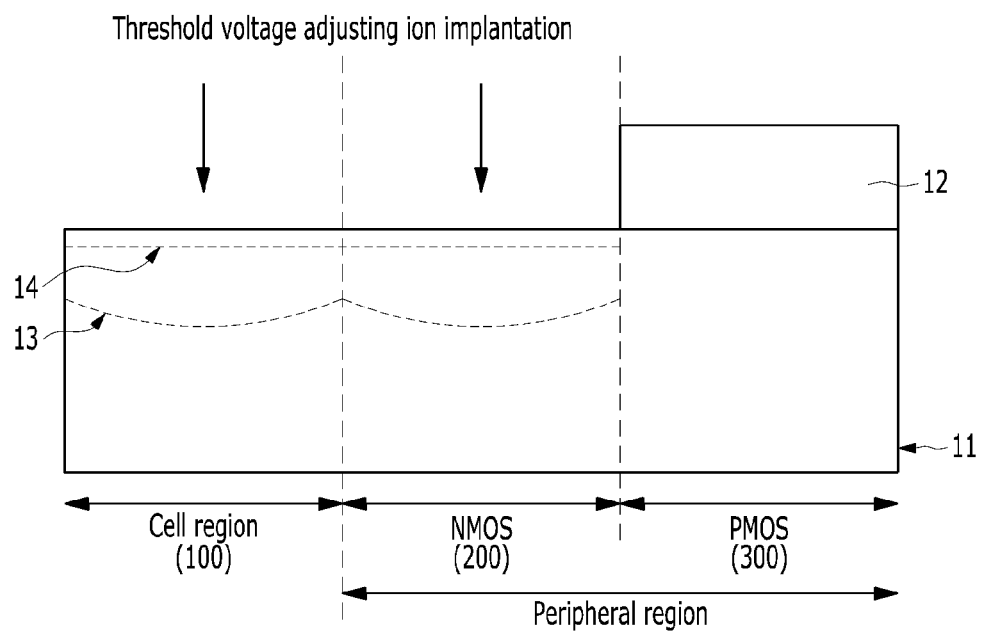

As shown in FIG. 1B, a threshold voltage adjusting ion implantation process may be performed over a surface of the substrate in the cell region 100 and the NMOS region 200. As a result, an ion implantation region 14 may be formed on the surface of the substrate 11. The threshold voltage adjusting ion implantation process is performed in order to decrease the threshold voltage of the NMOS region 200 and thus secure stable properties of devices. An N-type dopant may be used in the threshold voltage adjusting ion implantation process. For example, the N-type dopant may include arsenic (As), and thus arsenic may be used in performing the threshold voltage adjusting ion implantation. In particular, ion implantation energy is controlled such that a surface channel is maintained, that is, a buried channel is not formed at the bottom of a gate pattern in the cell region. The buried channel may be formed in a subsequent process.

For the purpose of the above, the threshold voltage adjusting ion implantation process may be performed in the NMOS region 200 when the ion implantation energy is lower than is commonly used. For example, in accordance with an embodiment, the ion implantation energy does not exceed 15 kilo electron-volts (KeV). In this case, a dose may be increased in comparison with the commonly used dose in order to complement the decreased energy. However, the ion implantation energy and the dose are not limited thereto and may be adjusted under a condition that a buried channel is not formed in the cell region depending on the device properties.

Figure 1C:
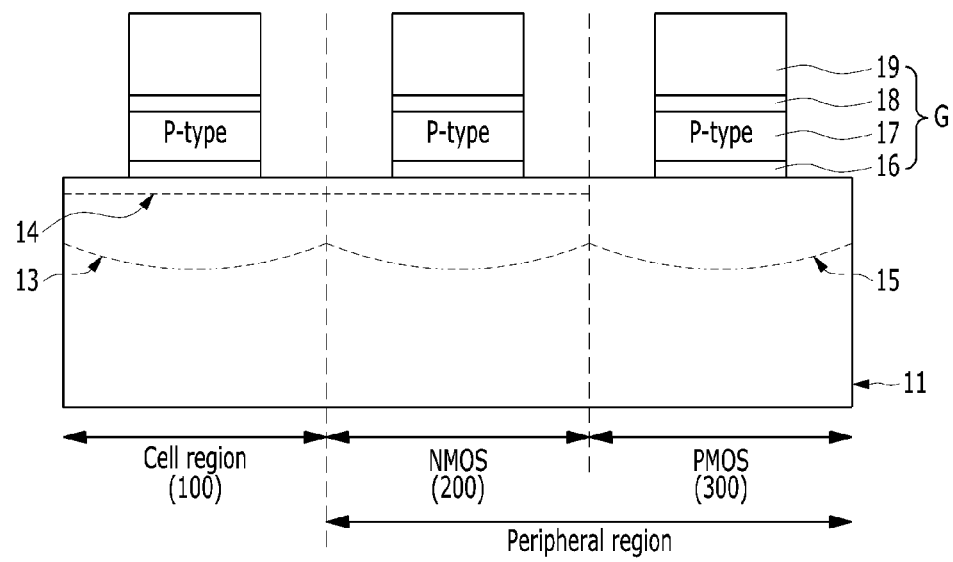

As shown in FIG. 1C, the first mask pattern 12 (see, FIG. 1B) may be removed. When the first mask pattern 12 is a photosensitive layer, the removal may be performed by dry etching. For example, the dry etching may include an oxygen stripping process.

A well forming ion implantation process may then be performed in the PMOS region 300. As such, an N-well region 15 may be formed in the PMOS region 300.

Gate patterns G including a floating gate electrode may be formed in respective regions on the substrate 11. In an embodiment, the floating gate electrode has a P-type conductivity. The gate patterns G, in one example, may be formed in the cell region 100 and the peripheral region. The gate patterns G may include a stack structure of a tunnel dielectric layer or tunnel barrier layer 16, a floating gate layer 17, a dielectric film 18, and a control gate layer 19. The gate patterns G may be formed by forming a stack of a dielectric layer for the tunnel dielectric layer 16, a P-type polysilicon layer for the floating gate layer 17, a dielectric layer for the dielectric film 18, and a conductive layer for the control gate layer 19 on the substrate 11 and then patterning the same.

The tunnel dielectric layer 16 may include a dielectric material. For example, the tunnel dielectric layer 16 may include oxide. The floating gate layer 17 may include the P-type polysilicon layer. The P-type polysilicon layer may be formed by forming a polysilicon layer and then converting the polysilicon layer into the P-type polysilicon layer through an ion implantation process, or by in-situ implantation of a P-type dopant when forming the polysilicon layer. The dielectric film 18 may include a dielectric material. For example, the dielectric layer 18 may include a stack structure such as oxide/nitride/oxide (ONO). The control gate layer 19 may include a conductive material. Specifically, in accordance with an embodiment, a P-type polysilicon layer may be employed as the floating gate layer 17 in the cell region 100 and the NMOS region 200. Since a P-gate in which the P-type polysilicon layer is employed has a work function higher than an N-gate, it is possible to improve erase speed and properties such as disturbance.

Figure 1D:
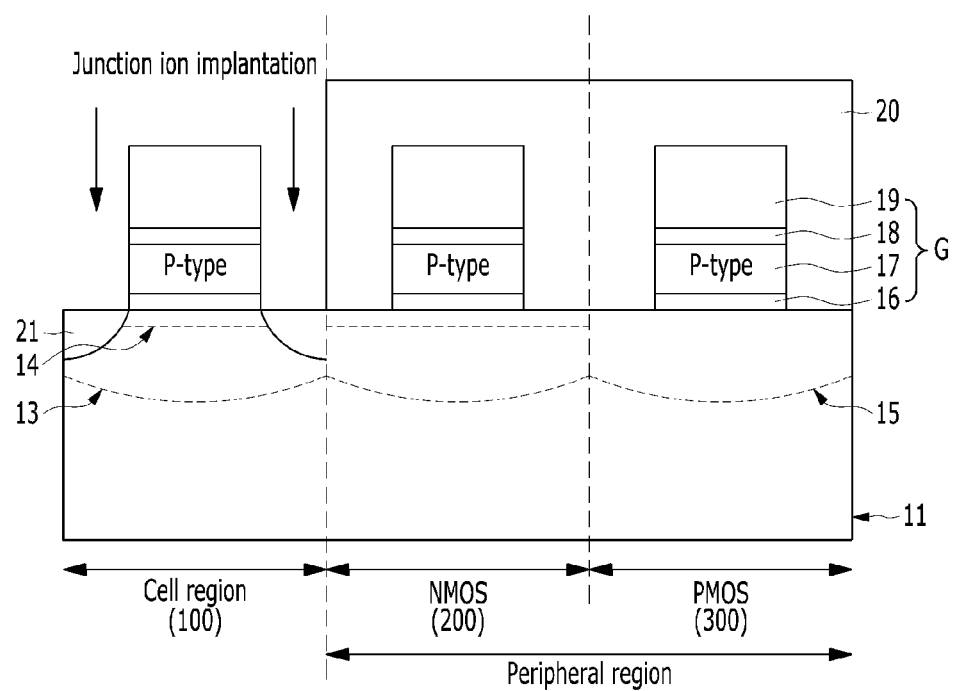

As shown in FIG. 1D, a second mask pattern 20 may be formed over the substrate 11 in the peripheral region 200 and 300. The second mask pattern 20 may be formed by coating a photosensitive layer to a thickness sufficient to bury the space between the gate patterns G in the peripheral region 200 and 300, and patterning the photosensitive layer to leave open the cell region 100 for exposure and development.

In one example, the second mask pattern 20 is formed before performing a junction ion implantation process which may be performed over a surface of the cell region 100. As a result, a source/drain region 21 may be formed on the substrate 11 in the cell region 100. The junction ion implantation process may be performed by counter doping. The junction ion implantation process may be performed by using a P-type dopant. For example, the P-type dopant may include boron.

Specifically, in accordance with an embodiment, the junction ion implantation process may be performed such that it is possible to offset the N-type dopant that is ion implanted on the substrate 11 in the cell region 100 as shown in FIG. 1B. For the same purpose, the junction ion implantation process may be performed with a dose higher than a common dose. This will be described in more detail through graphs shown in FIGS. 2A to 2D.

FIGS. 2A to 2D illustrate, depending on boron dose, program swing properties (see, FIG. 2A), program threshold voltage (VT) properties (see, FIG. 2B), program voltage properties (see, FIG. 2C), and program disturbance properties (see, FIG. 2D), respectively. A Comparative Example indicates the case where in FIG. 1B, the threshold voltage adjusting ion implantation process is not performed, that is, the surface channel is maintained. As shown in FIGS. 2A to 2D, when a boron dose is $1.1 \times 10^{13}$ atoms/cm$^2$, the properties are most similar to the Comparative Example.

Therefore, the junction ion implantation process may be performed for example, with the dose of at least $1.1 \times 10^{13}$ atoms/cm$^2$ or higher. However, the dose and the energy of the junction ion implantation process are not limited thereto, and may be adjusted when the N-type dopant ion implanted shown in FIG. 1B is offset to be similar to the Comparative Example which is not subject to the ion implantation.

Figure 1E:
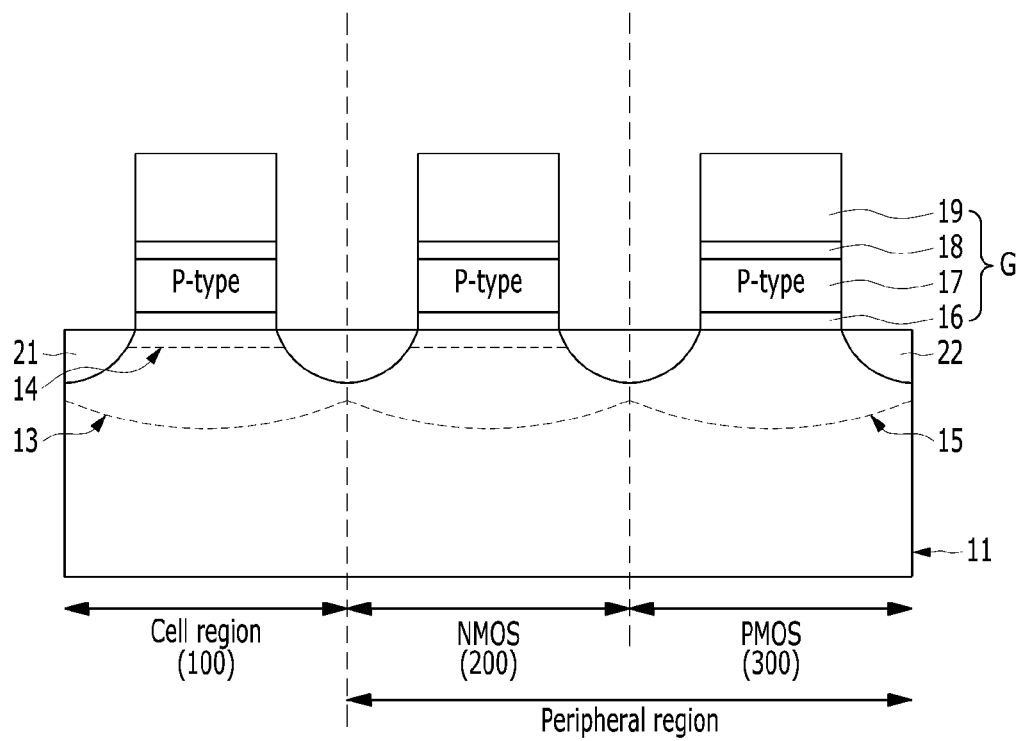
Figure 2A:
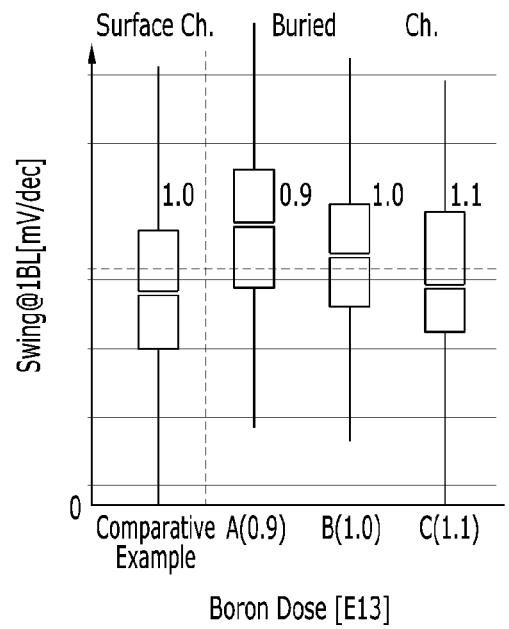
FIGS. 2A to 2D illustrate graphs showing device properties depending on boron dose.
Figure 2B:
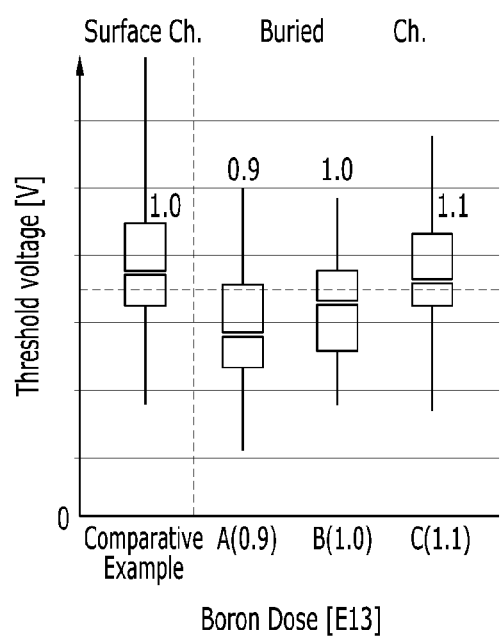
Figure 2C:
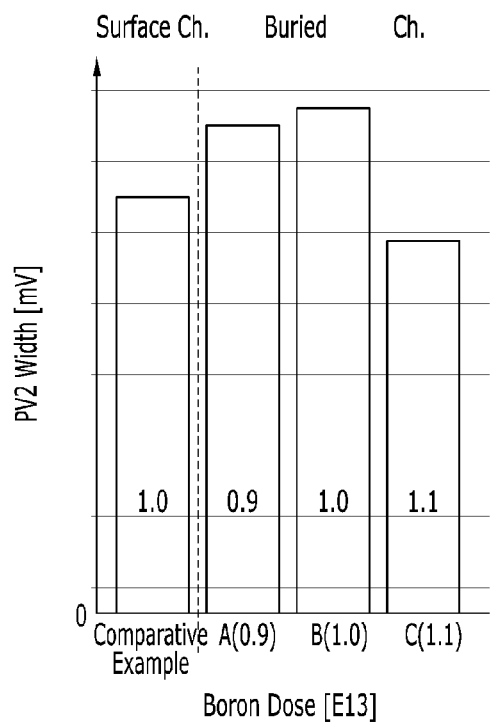
Figure 2D:
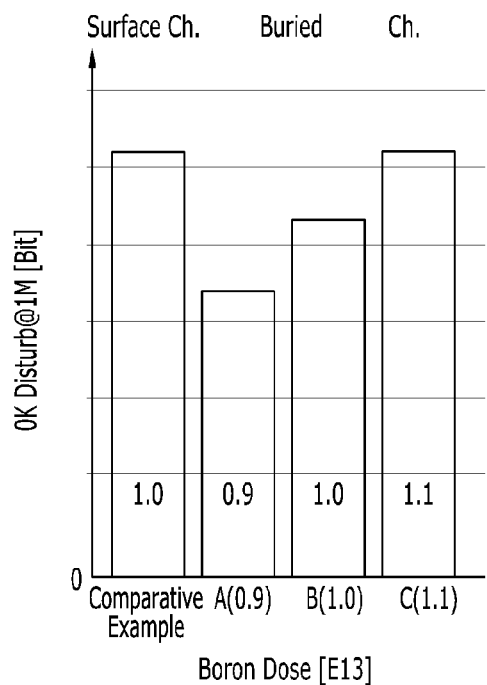
Figure 2E:
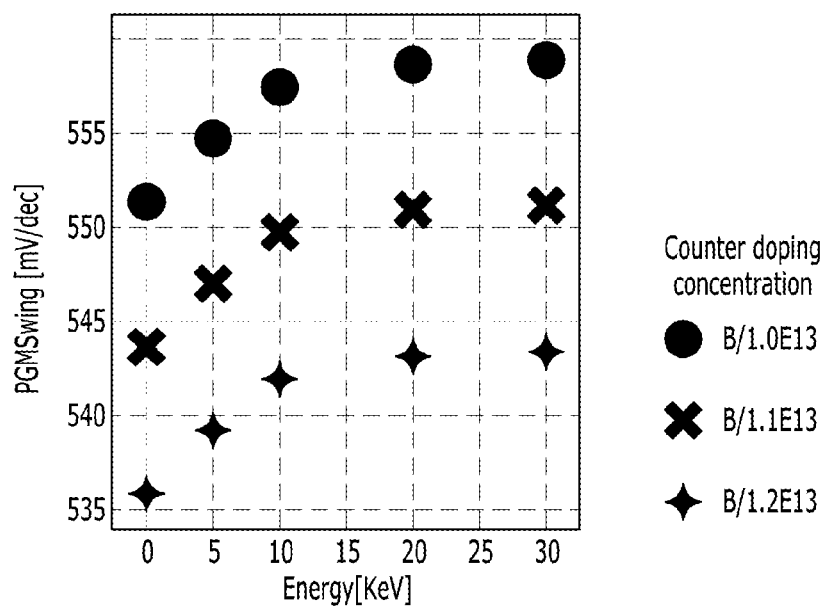

As shown in FIG. 1E, the second mask pattern 20 (see, FIG. 1D) may be removed. When the second mask pattern 20 is a photosensitive layer, the removal may be performed by dry etching. For example, the dry etching may include an oxygen stripping process.

Then, a source/drain region 22 may be formed by performing a junction ion implantation process on the substrate 11 in the peripheral region 200 and 300.

As is apparent from the above descriptions, according to the embodiments of the method for manufacturing the nonvolatile memory device, it is possible to improve device properties by employing a P-type gate and secure a process margin through omitting a mask process.

Although various embodiments have been described for illustrative purposes, it will be apparent to those skilled in the art that various changes and modifications may be made without departing from the spirit and scope of the invention as defined in the following claims.

What is claimed is:

1. A method for manufacturing a nonvolatile memory device comprising:
    providing a substrate comprising a cell region and a peripheral region, wherein the peripheral region comprises an NMOS region and a PMOS region;
    performing a well forming ion implantation over the substrate in the cell region and the NMOS region;
    performing a threshold voltage adjusting ion implantation over a surface of the substrate in the cell region and the NMOS region;
    forming a gate pattern comprising a floating gate electrode in the cell region and the peripheral region; and
    performing a junction ion implantation over a surface of the cell region,
    wherein the floating gate electrode has P-type conductivity.

2. The method according to claim 1, further comprising forming a first mask pattern which leaves open the cell region and the NMOS region, wherein the first mask pattern is formed over the substrate in the PMOS region before performing the well forming ion implantation.

3. The method according to claim 1, wherein in performing the well forming ion implantation, a P-type dopant for forming a P-type well is used.

4. The method according to claim 1, wherein in performing the threshold voltage adjusting ion implantation, an N-type dopant is used.

5. The method according to claim 1, wherein in performing the threshold voltage adjusting ion implantation, arsenic (As) is used.

6. The method according to claim 1, wherein in performing the threshold voltage adjusting ion implantation, ion implantation energy is controlled such that a buried channel is not formed at the bottom of the gate pattern in the cell region.

7. The method according to claim 1, further comprising forming a second mask pattern in the peripheral region, wherein the second mask pattern leaves open the cell region over the substrate and the second mask pattern is formed before performing the junction ion implantation.

8. The method according to claim 1, wherein performing the junction ion implantation is achieved with a counter doping.

9. The method according to claim 1, wherein in performing the junction ion implantation, dose is controlled such that a dopant which is implanted in the junction ion implantation is offset.

10. The method according to claim 1, wherein in performing the junction ion implantation, a P-type dopant is used.

11. The method according to claim 1, wherein in performing the junction ion implantation, boron is used.

12. The method according to claim 1, wherein forming the gate pattern comprises:
    forming a stack of a floating gate layer, a tunnel barrier layer and a control gate layer; and
    patterning the control gate layer, the tunnel barrier layer and the floating gate layer.

* * * * *